US005886454A

United States Patent [19]

Ito et al.

[11] Patent Number: 5,886,454

[45] Date of Patent: Mar. 23, 1999

[54] ULTRASONIC PROBE AND MANUFACTURING METHOD THEREOF

[75] Inventors: Yukio Ito, Machida; Yutaka Sato, Kashiwa; Toshio Kondo, Kunitachi; Takaya Ohsawa, Kitakatsushika-gun, all of Japan

[73] Assignee: Hitachi Medical Corporation, Tokyo, Japan

[21] Appl. No.: 801,643

[22] Filed: Feb. 18, 1997

[30] Foreign Application Priority Data

Feb. 29, 1996 [JP] Japan .................................... 8-067454

[51] Int. Cl.$^{6}$ ..................................................... H01L 41/08

[52] U.S. Cl. .......................... 310/322; 310/334; 310/326; 310/327

[58] Field of Search .................................... 310/322, 326, 310/327, 334, 335

[56] References Cited

U.S. PATENT DOCUMENTS 4,571,520 2/1986 Saito et al. .............................. 310/327
5,030,874 7/1991 Saito et al. .............................. 310/334
5,042,493 8/1991 Saito et al. .......................... 310/369 X

*Primary Examiner*—Mark O. Budd
*Assistant Examiner*—Timothy A Williams
*Attorney, Agent, or Firm*—Antonelli, Terry, Stout & Kraus, LLP

[57] ABSTRACT

An ultrasonic probe includes a plurality of piezoelectric elements arrayed on acoustic absorption backing material with predetermined spaces, a plurality of acoustic matching members formed on the piezoelectric elements and arrayed with gaps smaller than array gaps of the piezoelectric elements, polymer resin with which only the gaps between the piezoelectric elements are filled and having hardness lower than material of the piezoelectric elements, and an acoustic lens formed on the plurality of acoustic matching members.

14 Claims, 4 Drawing Sheets

ULTRASONIC PROBE AND MANUFACTURING METHOD THEREOF

BACKGROUND OF THE INVENTION

The present invention relates to an ultrasonic probe used in the field of an ultrasonic apparatus for extracting an image of the inner part of an object to be examined by means of ultrasonic beams and particularly to the technique for obtaining a satisfactory ultrasonic image.

An ultrasonic diagnostic apparatus employs an ultrasonic probe to transmit ultrasonic beams to the inner part of an object to be examined and receive an echo signal from the inner part of the object. As the ultrasonic probe, there are one having an array transducer composed of a large number of elongate rod-like elements and another having a single disk-shaped element transducer. The former is largely used in a so-called electronic scanning type ultrasonic apparatus and the latter is chiefly used in a mechanical scanning type ultrasonic apparatus.

In the electronic scanning type ultrasonic apparatus, a plurality of elongate rod-like elements are constituted as one group and the respective elements in the group are given predetermined delay times, respectively, so that each element is driven with the predetermined delay time given thereto. Thus, the probe transmits an ultrasonic beam focused at a predetermined depth in a predetermined direction within the object to be examined. Further, upon reception of the echo signal, the respective elements are also given delay times varying with time to thereby receive an ultrasonic beam from a predetermined direction. The ultrasonic beam for transmission and reception is moved in the azimuth direction of the elements to scan the inner part of the object, so that ultrasonic image data are obtained.

In order to obtain a satisfactory ultrasonic image by the scanning, it is necessary to form the narrow ultrasonic beam which has the excellent directivity over the whole scanning range of the beam. For this purpose, it is important that the acoustic crosstalk between adjacent elements is small.

The basic structure of the ultrasonic probe generally includes an acoustic absorption backing material, a piezoelectric element, an acoustic matching layer and an acoustic lens which are laminated in order. In order to reduce the acoustic crosstalk between the adjacent elements, that is, in order to improve isolation between the adjacent elements, the element is cut together with the acoustic matching layer deeply to the degree that gaps are formed in the acoustic absorption backing material, so that the cut elements are separated from each other. The gaps are filled with polymer resin in order to prevent the elements from being damaged when external force is exerted to the elements. In other words, the conventional ultrasonic probe is manufactured by way of the process in which the piezoelectric element and the acoustic matching layer are first fixed on the acoustic absorption backing material and are then cut by a dicing saw to form an array of the piezoelectric elements. Accordingly, in the ultrasonic probe using the conventional manufacturing method, it is a matter of course that the width of the array of the piezoelectric elements is equal to that of the acoustic matching layer.

Accordingly, in the conventional probe, area for transmission and reception of the element is identical with that of the acoustic matching layer. Further, in the prior art, gaps between the piezoelectric elements are also filled with polymer resin, while the filling of polymer resin is made after cutting the acoustic matching layer and the piezoelectric material with electrodes simultaneously, in order to prevent damage of the piezoelectric elements when external force exceeding forecasted force in the diagnosis is exerted to the elements and accordingly both of gaps between the piezoelectric elements and between the acoustic matching layer elements are filled with the polymer resin.

Recently, the array of the piezoelectric elements of the ultrasonic probe tend to be made small and densified to form the high density structure in order to increase the lateral resolution of an image. Therefore, the width of the array element is as narrow as about 0.2 mm. On the other hand, since the thickness of the piezoelectric element is determined by a frequency or a wavelength $\lambda$ (actually $\lambda/2$) of ultrasonic beams, the thickness of the piezoelectric element of the probe is, for example, about 0.44 mm for a frequency of ultrasonic beams of 3.5 MHz and about 0.6 mm for a frequency of 2.5 MHz. Accordingly, as the frequency of ultrasonic beams is low, a ratio of the thickness and the width of the piezoelectric element is large. When the piezoelectric elements are made small for the high density structure, the following problems occur.

More particularly, since miniaturization of the piezoelectric elements for attainment of the high density structure is to narrow the width of the element, it is meant that energy of ultrasonic beams transmitted by a single piezoelectric element and energy of ultrasonic beams received by the single piezoelectric element are reduced as compared with the prior art. That is, the sensitivity of the piezoelectric element is reduced. When the reduction of the sensitivity is to be compensated by a receiving circuit, noise is introduced by an amplifier of a signal and a complicated circuit for preventing the introduction of noise is required.

Further, when the piezoelectric elements having the width of 0.2 mm as described above are formed, the width of the gaps between the piezoelectric elements is as narrow as about 0.075 mm. It is extremely difficult as compared with the prior art to form the gaps having such a width by means of a dicing saw while the acoustic matching layer and the piezoelectric material are adhered to each other as in the prior art. Since the depth of the gaps must be made deeper as the frequency of ultrasonic beams is lower, the difficulty to form the gaps is increased.

Furthermore, since the width of the elements is very narrow and the strength thereof is reduced due to the high density structure of the piezoelectric elements, gaps between the elements are filled with polymer resin to increase the strength, while there is a problem that acoustic crosstalk is produced between adjacent piezoelectric elements through the polymer resin when the elements are driven. In addition, since the width of the gaps relative to the width of the piezoelectric elements is increased, a problem concerning the grating lobe also remains.

On the other hand, attainment of the broad bandwidth is also treated as a problem heretofore apart from the high density structure of the piezoelectric elements, while any methods for solving this problem are not found at the present time and presentation of some solving methods thereof is desired.

It is an object of the present invention to solve the above problems by providing an ultrasonic probe capable of obtaining a satisfactory ultrasonic image.

SUMMARY OF THE INVENTION

In order to solve the above problems, in the ultrasonic probe of the present invention including a plurality of small piezoelectric elements arrayed with predetermined gaps on acoustic absorption backing material and acoustic matching members laminated in the thickness direction of the piezoelectric elements, the acoustic matching layers are disposed individually for each piezoelectric element and each of the acoustic matching members disposed for each piezoelectric element has a transmitting and receiving area of ultrasonic beams larger than that of each of the piezoelectric elements. The gaps of the arrayed piezoelectric elements are filled with polymer resin having hardness lower than that of piezoelectric material of the piezoelectric elements, preferably, polymer resin containing micro hollow spheres or micro balloons mixed therein, if necessary.

According to another aspect of the present invention, the acoustic matching members are disposed individually for each piezoelectric element and adjacent acoustic matching members are disposed with gaps smaller than arrangement gaps of the piezoelectric elements. Only the gaps of the arrayed piezoelectric elements are filled with polymer resin having hardness lower than that of piezoelectric material of the piezoelectric elements, preferably, polymer resin containing micro balloons mixed therein, if necessary.

The method of manufacturing the ultrasonic probe of the present invention comprises a step of fixing a piezoelectric plate on acoustic absorption backing material, a step of cutting the piezoelectric plate in the direction perpendicular to the fixed surface at a previously set pitch by using a tool having a first predetermined thickness to form an array of a plurality of piezoelectric elements, a step of fixing an acoustic matching layer on the piezoelectric elements, and a step of forming array gaps, narrower than array gaps of the piezoelectric elements, in the acoustic matching layer at a pitch of gaps of the piezoelectric elements by using a tool thinner than the first thickness. After the cutting step of the piezoelectric elements, the manufacturing method further comprises a step of filling the gaps or gaps between the piezoelectric elements with polymer resin having hardness lower than the piezoelectric material if necessary.

According to the present invention, in the probe having the arrayed piezoelectric elements, the width of gaps between the acoustic matching members is made narrower than the width of gaps between the piezoelectric elements and the gaps between the piezoelectric elements are filled with polymer resin, so that the sensitivity of the probe can be improved and the bandwidth of the frequency characteristic can be spread. Accordingly, there can provide the probe capable of producing a satisfactory ultrasonic image having the high diagnostic performance. Further, since the width of gaps of the acoustic matching members is made small as compared with the array pitch of the piezoelectric elements, the magnitude of the grating lobe can be made small as compared with the prior art and an image having an improved signal-to-noise ratio is obtained. Furthermore, since the acoustic matching layer is cut and polymer resin containing micro balloons mixed therein is used as polymer resin with which gaps between the piezoelectric elements are filled to thereby be able to reduce the acoustic crosstalk between adjacent elements, there can be realized a high-performance probe having the excellent directivity of an ultrasonic beam.

In addition, since the cutting process of the piezoelectric material made of inorganic ceramic and the cutting process of the acoustic matching layer are made separately at different times, a small dicing saw can be used for the latter cutting process and thus the life of the dicing saw can be extended.

DESCRIPTION OF THE PREFERRED EMBODIMENTS

Figure 1:
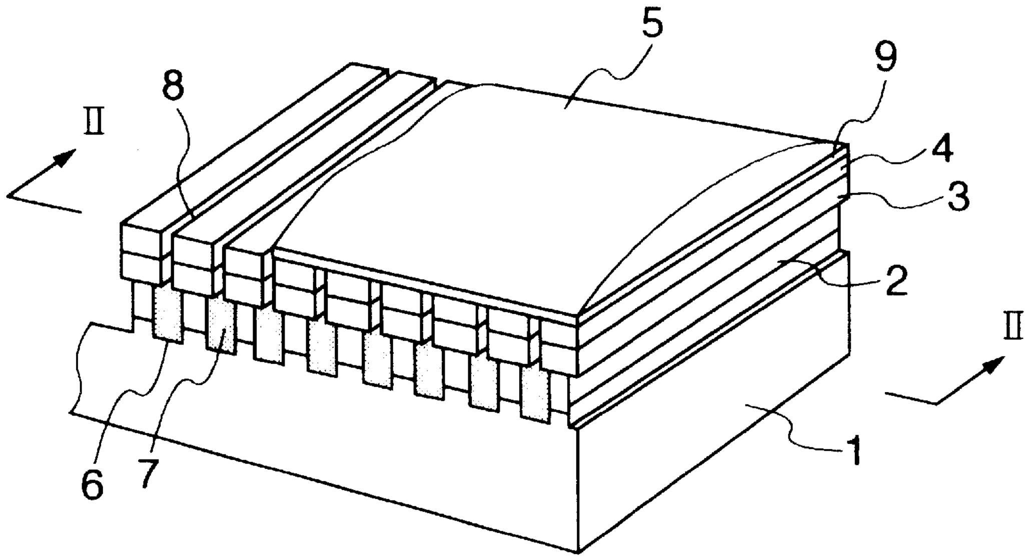
FIG. 1 is a partially sectional view showing an internal structure of a probe with a case and a connection board removed, to which the present invention is applied.

Embodiments of the present invention are now described with reference to the accompanying drawings. FIG. 1 illustrates an internal structure of an ultrasonic probe with a case and a connection board thereof removed and a part of constituent elements cut away. In FIG. 1, numeral 1 denotes an acoustic absorption backing material made of rubber containing powders of barium ferrite and 2 denotes an piezoelectric element fixedly mounted on the acoustic absorption backing material 1 by an adhesive agent. The piezoelectric element 2 is composed of PZT ceramic material with electrodes formed on both upper and lower surfaces and both sides by means of the printing and baking technique. As shown in FIG. 1, the piezoelectric element 2 includes elongate rod-like piezoelectric elements each having a rectangular section and arrayed at predetermined intervals. Numeral 3 denotes a first acoustic matching layer and 4 denotes a second acoustic matching layer. The first acoustic matching layer 3 is made of epoxy resin having powder of tungsten mixed therein and the second acoustic matching layer 4 is made of polyurethane resin. These acoustic matching layers are formed with a thickness of a quarter of a wavelength ($\lambda$) determined by a propagation velocity of ultrasonic beams of material as well known. Numeral 5 denotes an acoustic lens adhered on the second acoustic matching layer 4 by an adhesive agent and which serves to focus ultrasonic beams transmitted by the piezoelectric element 2 at a certain depth within the surface (in a short axis direction of arrayed piezoelectric elements) perpendicular to the array direction of the piezoelectric elements. Numeral 9 denotes a thermally meltable adhesive film. The above structure is the same as that of a heretofore known ultrasonic probe. The acoustic matching layer may be one layer or three layers or more in number.

Figure 2:
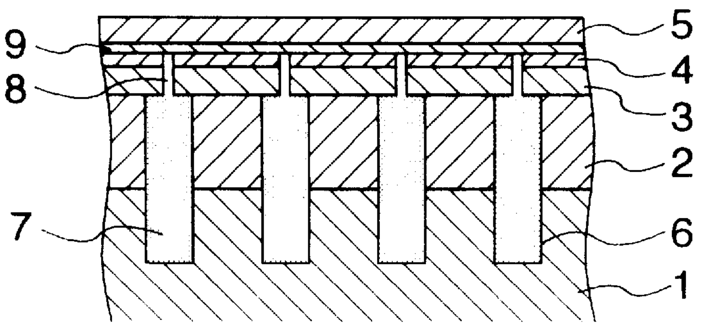
FIG. 2 is a sectional view showing array elements of the probe of the present invention in detail.

The features of the present invention in the structure shown in FIG. 1 are now described with reference to FIG. 2 which shows a sectional view cut with arrows II—II in FIG. 1. Gaps 6 between the piezoelectric elements 2 are filled with polymer resin 7 having a hardness lower than that of piezoelectric material and containing hollow spheres or balloons mixed therein. The first and second acoustic matching layers 3 and 4 disposed on the piezoelectric element 2 are cut at the position corresponding to the middle of the gaps 6 with gaps 8 narrower than the gaps 6. Consequently, an area of a transmitting and receiving surface of the acoustic matching layers is made wider than that of the elements as viewed from the transmitting and receiving direction of ultrasonic beam. Only the gaps between the piezoelectric elements are filled with the polymer resin 7 containing balloons and the gaps 8 of the first and second acoustic matching layers are not filled with the polymer resin 7.

The relation in size of the transmitting and receiving areas of the piezoelectric element to that of the acoustic matching layers is now described. The lateral resolution of an image of an ultrasonic diagnostic apparatus is closely related to the ultrasonic beam width (density of scanning lines) and the ultrasonic beam width is deeply related to an array of piezoelectric elements of the ultrasonic probe, specifically a pitch of the array. Recently, in order to improve the resolution of the ultrasonic image, there is a tendency that the probe is formed with high density, that is, the pitch of the array of piezoelectric elements is made smaller. To this end, the piezoelectric elements themselves are formed finely. By finely forming the piezoelectric elements, ultrasonic energy capable of being transmitted by the individual piezoelectric elements is reduced and ultrasonic energy capable of being received by the individual piezoelectric elements is also reduced as compared with the prior art, so that the sensitivity of the probe is reduced. In order to prevent reduction of the sensitivity to the utmost, it is necessary to make the width of the gaps formed by cutting the piezoelectric plate as narrow as possible. However, there is a limitation due to the trade-off of the strength of a tool and the hardness of the material, because ceramics are used as the piezoelectric material. For example, in a current finely formed probe for 3.5 MHz, the widths of gaps and piezoelectric elements are of the order of 0.075 mm and 0.145 mm, respectively, when the array pitch of the piezoelectric elements is 0.22 mm. Accordingly, only a portion of about 66% for the array pitch of 0.22 mm contributes to transmission and reception of ultrasonic beams.

In the present invention, the gaps of the acoustic matching layer are made narrower than gaps of the piezoelectric element. In other words, the transmitting and receiving area of the acoustic matching layer is made wider than the transmitting and receiving area of the piezoelectric element. For example, for the arrayed piezoelectric elements having the array pitch of 0.22 mm, the piezoelectric material is cut to form gaps having a width of 0.075 mm and the acoustic matching layer is cut to form gaps having a width of 0.015 mm. For a single element, the width of the piezoelectric element is 0.145 mm and the width of the acoustic matching layer is 0.205 mm so that the acoustic matching layer is protruded or extended by 0.03 mm from both end surfaces of the piezoelectric elements in the width direction to form a T-shaped section, so that portion of 93% or more of the array pitch of 0.22 mm can contribute to transmission and reception.

When the piezoelectric elements having the T-shaped section are driven, transmission and reception of ultrasonic energy are made from the surface of the acoustic matching layer. Accordingly, vibration of the piezoelectric elements upon transmission is made by the large area of the acoustic matching layer and the echo signal from the inner part of a living body is received by the large area of the acoustic matching layer to be propagated to the piezoelectric elements having the small area. That is, the relation between the small transmitting and receiving area of the piezoelectric elements and the large transmitting and receiving area of the acoustic matching layer can be used to amplify the transmission and reception energy so that the sensitivity of the probe can be improved.

Action of the polymer resin containing the balloons with which the gaps of the piezoelectric elements are filled is now described. As described above, there is an example where gaps between piezoelectric elements are filled with polymer resin heretofore, while in this case not only the gaps between the piezoelectric elements but also gaps of the acoustic matching layer are filled with polymer resin. Accordingly, cut members of the acoustic matching layer are coupled with each other through the polymer resin and acoustic crosstalk between the piezoelectric elements is effected through the polymer resin in the gaps of the elements to thereby cause leakage and transmission of vibration of the piezoelectric elements to adjacent piezoelectric elements.

Accordingly, the present invention pays attention to the fact that polyurethane resin having hollow spheres, for example, micro balloons of vinylidene mixed therein can be used as the polymer resin to improve the acoustic insulation so that the acoustic coupling, that is, cross talk between adjacent piezoelectric elements can be reduced. Since it is not necessary for the protection of the piezoelectric element that the gaps of the acoustic matching layer are filled with resin, only the gaps of the piezoelectric elements are filled with resin. Consequently, since the gaps between the adjacent piezoelectric elements are filled with the polymer resin having the satisfactory acoustic insulation and the acoustic matching members are separated for each piezoelectric element, the cross talk between the piezoelectric elements can be reduced as compared with the conventional probe.

Figure 4:
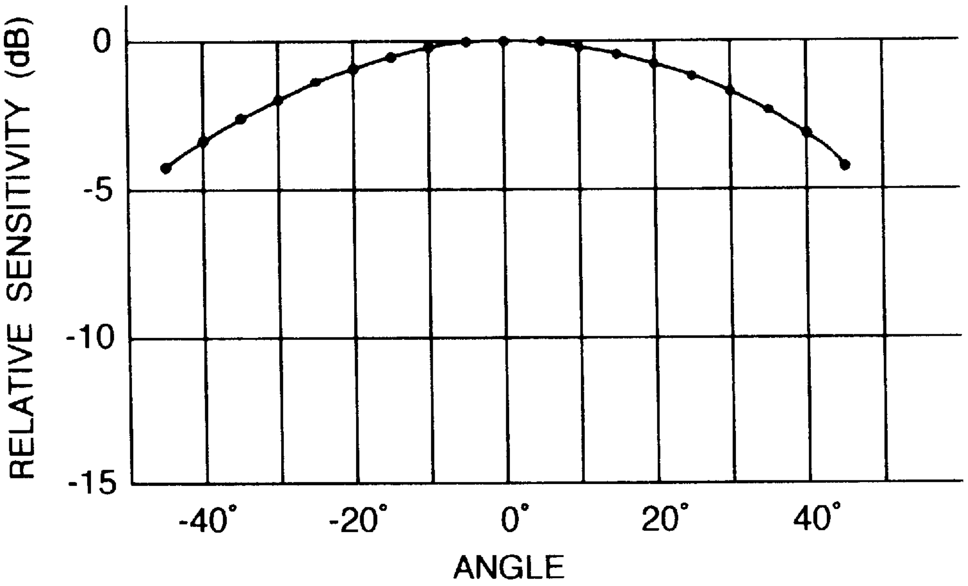
FIG. 4 is a graph showing the dependence on angle of the sensitivity to transmission beams of an ultrasonic probe of the present invention.

The aforementioned action can be explained with reference to FIG. 4, which is a graph showing a measured result using a hydrophone, of the dependence on an angle of the sensitivity to transmission beams of the single piezoelectric element. The sensitivity in the direction of 45° of an ultrasonic beam transmitted by a single element to which the present invention is applied is −4.2 dB as represented by a relative value to the direction of 0°. This value can stand comparison with −3.8 dB in the case where gaps between the piezoelectric elements are filled with air and the satisfactory directivity is ensured.

Further, when the relation of the piezoelectric element 2, the acoustic matching layers 3 and 4 and the polymer resin 7 containing the balloons in the embodiment of the present invention are observed from a different standpoint, only the gaps between the piezoelectric elements 2 are filled with the polymer resin and accordingly each element is sandwiched by the polymer resin 7 from both sides thereof to form a composite structure. The composite structure can reduce the acoustic impedance of the element in the range of from 20 Mrayl (mega rayl) of piezoelectric ceramic to about 1 Mrayl of the polymer resin containing the balloons, so that the matching characteristic of the probe to a living body can be improved. Further, by mixing balloons into polymer resin and changing the mixture ratio, a combined value of the impedances can be set to a desired value and a value of Q of the piezoelectric element can be also reduced to a desired value. Accordingly, the ultrasonic probe having the broad band frequency characteristic can be attained. The mixture ratio of the micro balloons is 70% or less, preferably 50% or less in the volume percentage.

Figure 5:
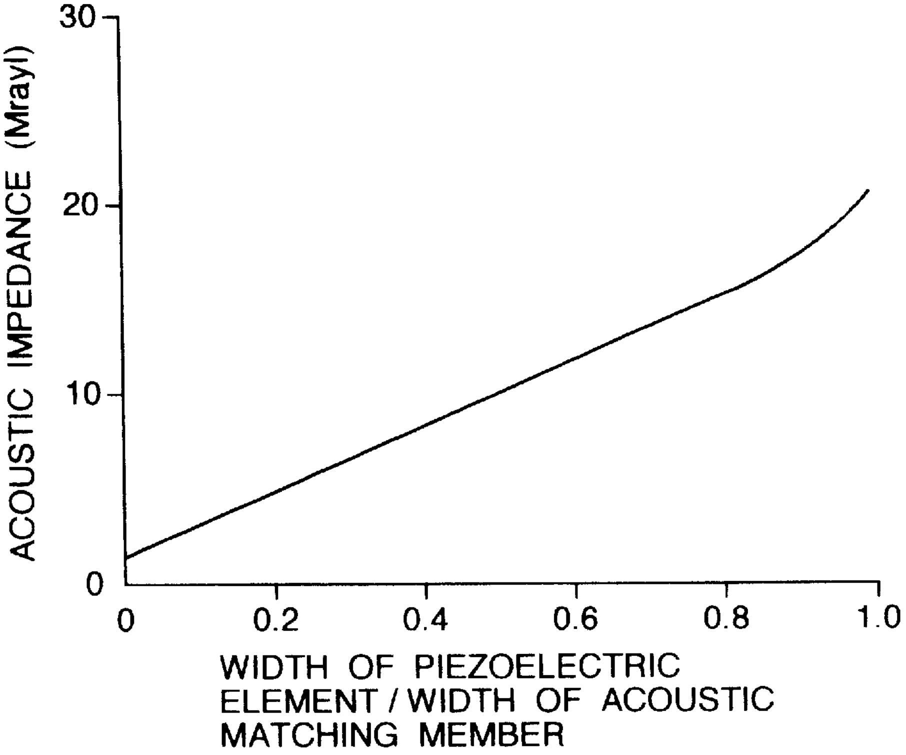
FIG. 5 is a graph showing a relationship, between a ratio of width of piezoelectric element to that of acoustic matching member and an acoustic impedance of array elements including compounded piezoelectric material and polymer resin containing micro balloons.

Referring now to FIG. 5, the effect obtained by the composite structure of the piezoelectric material formed by filling the gaps of the piezoelectric elements with the polymer resin containing the micro balloons mixed therein is described. In FIG. 5, the ordinate axis indicates an acoustic impedance of a transducer and the abscissa axis indicates a ratio of the width of the piezoelectric element to the width of the acoustic matching member. The reason why the ratio of the width of the piezoelectric element to the width of the acoustic matching member is used in the abscissa axis is that it is supposed that the polymer resin disposed just below the acoustic matching members contributes to the vibration performance of the piezoelectric elements. As apparent from FIG. 5, when the width of the piezoelectric element is reduced, a value of the acoustic impedance is made smaller. However, it is needless to say that the width of the piezoelectric element and the width of the acoustic matching member must be set in a proper range of FIG. 5 in implementation. Further, the probe of the embodiment of the present invention was used to measure a frequency characteristic by the pulse echo method as one effect of the composite structure of the piezoelectric material, so that a −6 dB bandwidth of 75% ($(f_1-f_2)/f_0=0.75$) for the center frequency $f_0$ of 3.5 MHz was obtained, and it was confirmed that the bandwidth is broadened as compared with a prior art.

In FIG. 5, a probe having the ratio of the width of the piezoelectric element to the width of the acoustic matching member equal to 1 corresponds to a conventional ultrasonic probe. An acoustic impedance at this time is 20 (Mrayl). An acoustic impedance of a living body is 1.5 (Mrayl). A reflectivity R of ultrasonic beams is expressed by the following equation:

$$R=(Z1-Z2)/(Z1+Z2)$$

where Z1 represents an acoustic impedance of a transducer and Z2 an acoustic impedance of a living body.

It is understood from the above equation that the larger the difference between the acoustic impedances of the probe and the living body, the larger the reflectivity, and the smaller the difference between the acoustic impedances between the acoustic impedances of the probe and the living body, the smaller the reflectivity. The larger the reflectivity, the more difficult the matching of the impedance while the smaller the reflectivity the easier the matching of the impedance.

In the present invention, as apparent from FIG. 5, the acoustic impedance of the transducer can be reduced close to the acoustic impedance of the living body and accordingly the impedance can be easily matched.

Further, since the impedance can be easily matched, the bandwidth of frequency is broader as compared with the prior art. Consequently, the length of ultrasonic pulses for radiation can be narrowed to thereby increase the resolution in the depth direction.

Generally, there is the characteristic that ultrasonic pulses with a low frequency have an inferior resolution but reach a deep area while ultrasonic pulses with a high frequency have a superior resolution but reach only a shallow area.

Accordingly, by using the transducer of the present invention, an object to be examined can be inspected or examined by various frequencies to obtain more information concerning the living body.

Figure 6A:
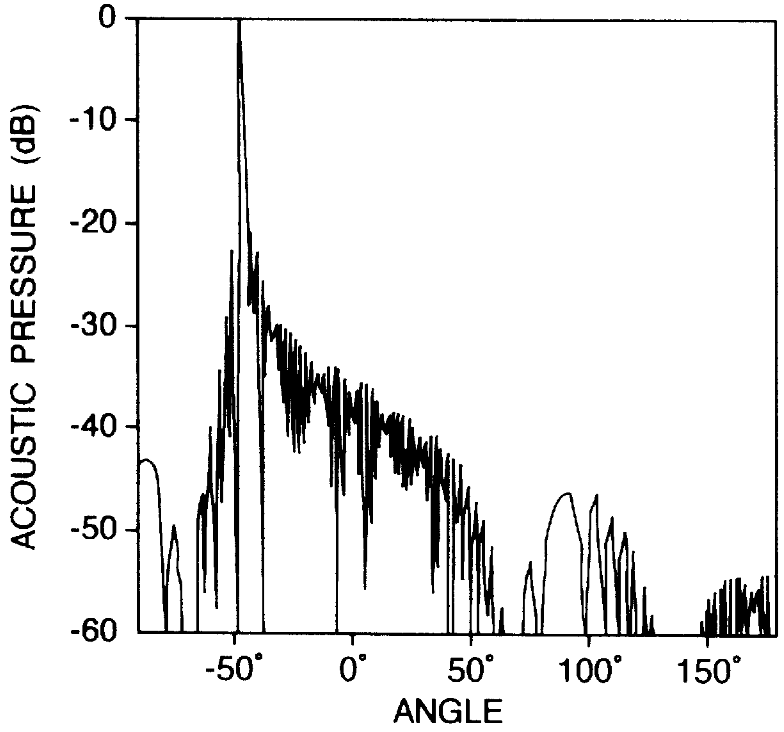
FIGS. 6A and 6B are graphs showing the grating lobe according to the present invention and the prior art, respectively.
Figure 6B:
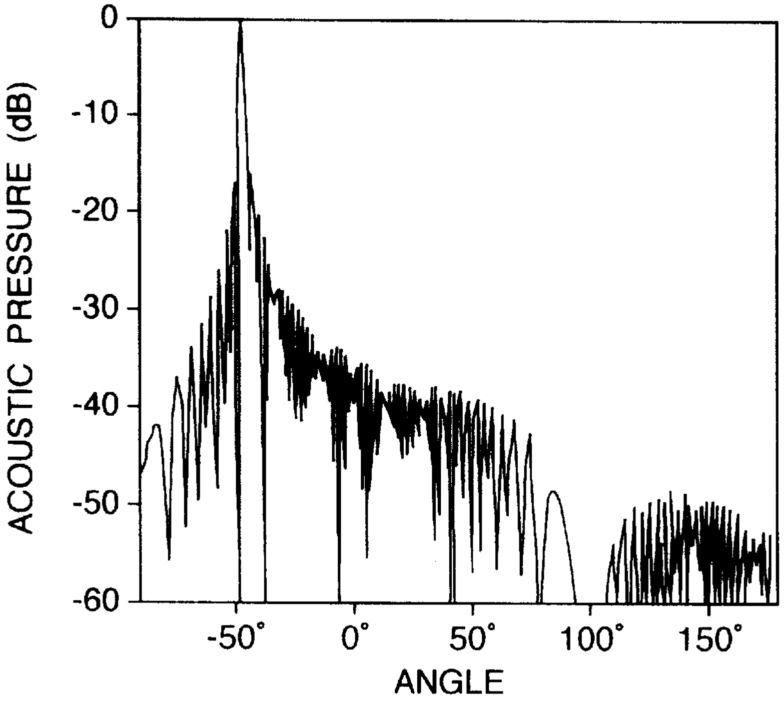
FIG.6B PRIOR ART

Furthermore, when the array state of the piezoelectric elements and the acoustic matching members of the present invention is compared with a prior art, a piezoelectric element and an acoustic matching layer in the prior art are cut with a blade of the same width and accordingly gaps between piezoelectric elements are large, that is, space between acoustic sources is large. Accordingly, in the prior art structure, the grating robe is apt to be produced. To the contrary, according to the present invention, since the acoustic matching layers can be regarded as acoustic sources, a space between the acoustic sources is very small as compared with the prior art and accordingly a magnitude of the grating robe can be made small. This operation is described with reference to FIGS. 6A and 6B. FIGS. 6A and 6B show simulated patterns of an ultrasonic beam transmitted and received in the direction of 45° by a phased-array type ultrasonic probe for a frequency of 3.5 MHz having piezoelectric elements arrayed at a pitch of 0.2 mm and cut with gaps of 0.075 mm. FIG. 6A shows a simulated beam pattern when the acoustic matching layer is cut with a blade of 0.015 mm width as in the present invention and FIG. 6B shows a simulated beam pattern when the piezoelectric element and the acoustic matching layer are cut with a blade of the same width of 0.075 mm as in the prior art. In FIGS. 6A and 6B, an acoustic pressure in each angular direction in case where the front direction of the arrayed piezoelectric elements is assumed to 0° and a beam is radiated left or right in direction of −45° is represented by dB. It is understood from the two drawings that the acoustic pressure of the beam is remarkably reduced in the periphery of an angle of 50° opposite to the beam direction with respect to the front direction when the present invention is applied. Accordingly, occurrence of artifact is reduced and a signal-to-noise ratio is improved. Increased ultra acoustic pressure of the beam in the vicinity of 50° in FIG. 6B is caused by the grating robe but can be reduced by the present invention.

Figure 3A:
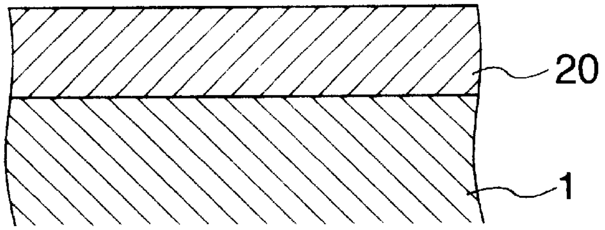
FIGS. 3A to 3E show processes of manufacturing ultrasonic array elements of the present invention.
Figure 3B:
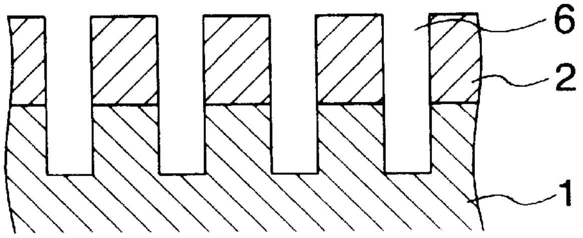

A method of manufacturing the above ultrasonic probe is now described. FIGS. 3A to 3E show manufacturing steps of a characteristic portion of the present invention. As shown in FIG. 3A, a piezoelectric plate 20 is adhered to the acoustic absorption backing material 1 by epoxy adhesive agent. After the adhesive agent is dried and the acoustic absorption backing material 1 and the piezoelectric plate 20 are fixed to each other, the plate 20 and the acoustic absorption backing material 1 are subjected to gap cutting work by a dicing saw to form arrayed piezoelectric elements 2 as shown in FIG. 3B. In an example of gaps 6, when piezoelectric material having a thickness of 0.44 mm is used, the gaps have the width of 0.075 mm, the pitch of 0.22 mm and the depth of 0.44 mm from the adhered boundary between the acoustic absorption backing material 1 and the piezoelectric element 2.

Figure 3C:
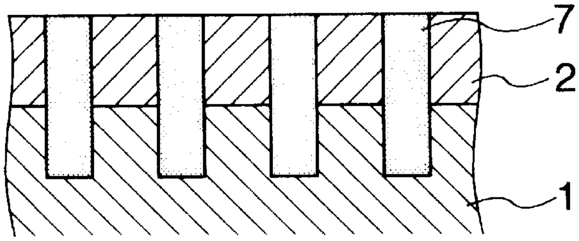

After the gaps have been formed, the gaps 6 between the piezoelectric elements are filled with polymer resin 7 while air is evacuated from the gaps, so that all inner portions of the gaps 6 including the bottom of the gaps 6 are filled with the polymer resin 7 (see FIG. 3C). The polymer resin may use polyurethane resin having micro balloons mixed therein by a predetermined ratio in the volume percentage, for example, polyurethane resin having micro balloons (having an average diameter of 20 to 50 μm) made of vinylidene chloride and mixed therein by 50% in the volume percentage.

Figure 3D:
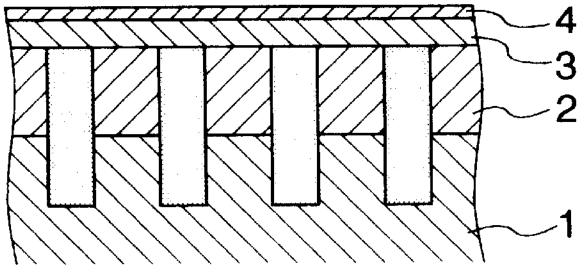

After the polymer resin 7 with which the gaps between the piezoelectric elements are filled has hardened, the first acoustic matching layer 3 and the second acoustic matching layer 4 both having the same width as the length of the arrayed piezoelectric elements 2 are adhered on the surface of the arrayed piezoelectric elements 2 by using epoxy adhesive agent as shown in FIG. 3D.

Figure 3E:
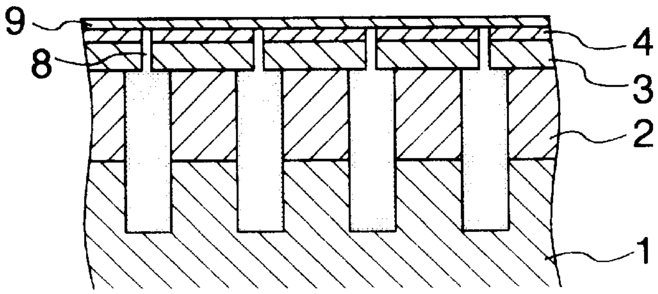

After the first and second acoustic matching layers 3 and 4 have been adhered on the arrayed piezoelectric elements, the first and second acoustic matching layers 3 and 4 are cut at a center portion thereof at the array pitch of the piezoelectric elements for each space between the piezoelectric elements by a dicing saw with a thinner blade than that of the dicing saw used to cut the piezoelectric plate 20 as shown in FIG. 3E. When the acoustic matching layers are cut, it is desirable that any jig is mounted on the acoustic matching layers or the acoustic matching layers are cooled so that the acoustic matching layers are apt to be worked. The width of the gaps 8 is, for example, of the order of 0.015 mm when the width of the gaps 6 of the piezoelectric element is 0.075 mm. The polymer resin 7 may be cut sightly upon cutting of the acoustic matching layers. In this manner, ultrasonic transducers having the acoustic matching layers with a transmitting and receiving area larger than that of the piezoelectric elements are formed on the piezoelectric elements.

After the acoustic matching layers have been cut, a thermally meltable adhesive film 9 is thermally adhered on the second acoustic matching layer 4 while the adhesive film is pressed on the layer with pressure. The thermally meltable adhesive film 9 serves to prevent water or medical fluid from penetrating into the probe externally of the probe to adversely affect the element and is made of polyurethane. The thickness of the adhesive film 9 is 0.02 mm. The thermally meltable adhesive film 9 is not particularly required for the purpose of the present invention. Thereafter, although not shown in FIG. 3, the acoustic lens 5 (FIG. 1) of silicon rubber is adhered on the thermally meltable adhesive film 9 by means of silicon adhesive agent. Finally, connection terminal plates (not shown) for connecting electrodes of the arrayed piezoelectric elements to the ultrasonic diagnostic apparatus body are mounted on the sides of the acoustic absorption backing material 1 to thereby complete an assemble of the ultrasonic probe.

According to the manufacturing method, since the piezoelectric material is cut before the acoustic matching layers are adhered on the piezoelectric material, the depth of the gaps can be made shallow to thereby use a small dicing saw and the life of the dicing saw can be extended even if wear of the dicing saw due to working is considered. Further, the process of filling the polymer resin 7 may be omitted if necessary.

The embodiment of the present invention has been described, while various modification can be made without departing from the gist of the present invention. For example, numerical values for the width of the gaps of the piezoelectric element, the array pitch of the piezoelectric elements, the blade width for cutting the acoustic matching layers and the like can be changed if necessary. For example, when a main object is to reduce the acoustic crosstalk between the piezoelectric elements as compared with improvement of the sensitivity of the probe, the width of the gaps of the piezoelectric material can be equal to the width of the gaps of the acoustic matching layers to thereby reduce working processes. Further, as the polymer resin, epoxy resin and silicon rubber resin can be used except the polyurethane resin. The micro balloons mixed into the polymer resin may be organic matter other than vinylidene chloride organic matter, for example, inorganic micro balloons of silica or the like.

Furthermore, it is needless to say that the present invention can be applied to a probe including elongate rod-like piezoelectric elements arrayed into an arcuate shape or a probe including piezoelectric elements arrayed on a flat surface or a curved surface in two dimensions in addition to the probe including the elongate rod-like piezoelectric elements arrayed on a flat surface in one direction as described in the embodiment of the present invention.

We claim:

1. An ultrasonic probe comprising:

a plurality of piezoelectric elements arrayed on acoustic absorption backing material with predetermined gaps therebetween;

a plurality of acoustic matching members laminated in the thickness direction of said piezoelectric elements and each being disposed individually for each of said piezoelectric elements and having a transmitting and receiving surface of ultrasonic beams larger than that of said piezoelectric element corresponding thereto; and an acoustic lens formed on said plurality of acoustic matching members.

2. An ultrasonic probe according to claim 1, further comprising polymer resin with which said gaps between said plurality of piezoelectric elements are filled and having hardness lower than material of said piezoelectric elements.

3. An ultrasonic probe according to claim 2, wherein said polymer resin contains a plurality of micro balloons therein.

4. An ultrasonic probe according to claim 1, wherein said piezoelectric elements are arrayed on a flat or curved surface in one direction.

5. An ultrasonic probe according to claim 1, wherein said piezoelectric elements are arrayed on a flat or curved surface in two dimensions.

6. An ultrasonic probe comprising:

a plurality of piezoelectric elements arrayed on acoustic absorption backing material with predetermined gaps therebetween;

a plurality of acoustic matching members laminated in the thickness direction of said piezoelectric elements and each being disposed individually for each of said piezoelectric elements, said acoustic matching members adjacent each other being arrayed with gaps smaller than said gaps between said piezoelectric elements; and an acoustic lens formed on said plurality of acoustic matching members.

7. An ultrasonic probe according to claim 6, further comprising polymer resin filled between said piezoelectric elements, said polymer resin having hardness lower than that of material of said piezoelectric elements.

8. An ultrasonic probe according to claim 6, wherein said polymer resin contains a plurality of micro balloons therein.

9. An ultrasonic probe according to claim 8, wherein said polymer resin contains a plurality of micro balloons therein by 50 percents or less in the volume percentage.

10. An ultrasonic probe according to claim 6, wherein said piezoelectric elements are arrayed on a flat or curved surface in one direction.

11. An ultrasonic probe according to claim 6, wherein said piezoelectric elements are arrayed on a flat or curved surface in two dimensions.

12. An ultrasonic probe according to claim 1, wherein said plurality of acoustic matching members are separated from one another and a respective one of said acoustic matching members is disposed individually for a respective one of said piezoelectric elements.

13. An ultrasonic probe according to claim 12, wherein said plurality of acoustic matching members are separated from one another by a gap smaller than said predetermined gap between said plurality of piezoelectric elements.

14. An ultrasonic probe according to claim 13, wherein each of said plurality of acoustic matching members includes first and second layers of acoustic matching material arranged in the thickness direction of said piezoelectric elements.

* * * * *